(12) United States Patent
Lim et al.

(10) Patent No.: US 9,673,418 B2
(45) Date of Patent: Jun. 6, 2017

(54) DISPLAY DEVICE

(71) Applicant: SAMSUNG DISPLAY CO., LTD., Yongin-si, Gyeonggi-do (KR)

(72) Inventors: Sanghoon Lim, Cheonan-si (KR); Kwanyoung Han, Seongnam-si (KR); Jaeyoung Yu, Asan-si (KR); Kyongbin Jin, Suwon-si (KR); Jongsung You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/857,739

(22) Filed: Sep. 17, 2015

(65) Prior Publication Data

US 2016/0276419 A1    Sep. 22, 2016

(30) Foreign Application Priority Data

Mar. 20, 2015  (KR) .......................... 10-2015-0038819

(51) Int. Cl.
   *H01L 27/14*  (2006.01)
   *H01L 51/52*  (2006.01)

(52) U.S. Cl.
   CPC ........ *H01L 51/5246* (2013.01); *H01L 51/524* (2013.01)

(58) Field of Classification Search
   CPC ............. H01L 27/3246; H01L 27/3241; H01L 27/3244; H01L 27/3281; H01L 27/3293; H01L 27/32; H01L 51/524; H01L 51/5246
   See application file for complete search history.

(56) References Cited

U.S. PATENT DOCUMENTS

| | | | |
|---|---|---|---|
| 6,413,790 B1* | 7/2002 | Duthaler | ................ B82Y 30/00 |
| | | | 257/E27.119 |
| 6,891,325 B1* | 5/2005 | Nice | ................... H01L 51/5012 |
| | | | 216/24 |
| 2004/0238827 A1* | 12/2004 | Takayama | ........... H01L 27/1214 |
| | | | 257/79 |

(Continued)

FOREIGN PATENT DOCUMENTS

| KR | 10-2012-0006175 A | 1/2012 |
|---|---|---|
| KR | 10-2012-0038114 A | 4/2012 |

(Continued)

OTHER PUBLICATIONS

Alexander, M.R. et al., "A study of HMDSO/O2 plasma deposits using a high sensitivity and -energy resolution XPS instrument: curve fitting of the Si 2p core level", Applied Surface Science, 1999, vol. 137, pp. 179-183, Elsevier Science B.V.

(Continued)

*Primary Examiner* — Yosef Gebreyesus
(74) *Attorney, Agent, or Firm* — Lewis Roca Rothgerber Christie LLP

(57) ABSTRACT

Provided is a display device including a display panel configured to display an image, and a window panel located on the display panel, the window panel having a display area for transmitting an image displayed on the display panel, and a non-display area surrounding the display area, wherein the window panel includes a window substrate, and a print layer on a lower surface of the window substrate in the non-display area, and including a silicon-based polymer or a fluorine-based polymer.

14 Claims, 6 Drawing Sheets

(56) References Cited

U.S. PATENT DOCUMENTS

| | | | |
|---|---|---|---|
| 2005/0258443 A1* | 11/2005 | Yamazaki | H01L 27/3244 257/93 |
| 2007/0126349 A1* | 6/2007 | Hu | H01L 27/3267 313/506 |
| 2012/0162106 A1 | 6/2012 | Choi et al. | |
| 2013/0082961 A1* | 4/2013 | Wang | G06F 3/044 345/173 |
| 2014/0146245 A1* | 5/2014 | Ahn | G06F 3/041 349/12 |
| 2014/0153100 A1 | 6/2014 | Yi | |
| 2015/0092123 A1* | 4/2015 | Gotoh | B32B 27/20 349/12 |

FOREIGN PATENT DOCUMENTS

| | | |
|---|---|---|
| KR | 10-2012-0075103 A | 7/2012 |
| KR | 10-2014-0071093 A | 6/2014 |

OTHER PUBLICATIONS

Kumar, Amit et al., "Patterning Self-Assembled Monolayers: Applications in Materials Science", Langmuir, 1994, vol. 10, No. 5, pp. 1498-1511, American Chemical Society.

Park, Hong-Soo et al., "Synthesis of Silicone-Acrylic Resins and Their Applications to Superweatherable Coatings", Journal of Applied Polymer Science, 2001, vol. 81, pp. 1614-1623, John Wiley & Sons, Inc.

* cited by examiner

DISPLAY DEVICE

CROSS-REFERENCE TO RELATED APPLICATION

This application claims priority to and the benefit of Korean Patent Application No. 10-2015-0038819, filed on Mar. 20, 2015, with the Korean Intellectual Property Office, the disclosure of which is incorporated herein in its entirety by reference.

BACKGROUND

1. Field

Aspects of embodiments of the present invention relate to a display device including a window panel having a print layer located thereon, and a method of manufacturing the display device.

2. Description of the Related Art

In general, flat panel display devices, such as a liquid crystal display ("LCD") device and an organic light emitting diode ("OLED") display device, include a plurality of electrode pairs for generating electric fields, and an electro-optical active layer interposed therebetween. The LCD device may include a liquid crystal layer as the electro-optical active layer, and the OLED display device may include an organic light emitting layer as the electro-optical active layer.

Display devices include a display panel configured to generate and display an image, and a window panel located on the display panel to protect. An image generated from the display panel may pass through the window panel to be provided to an observer. The window panel may include a window substrate and a print layer located on the window substrate. The print layer may serve as a factor for determining the color of the window panel, and may be designed to have various suitable colors.

Subsequent to the window panel being adhered to an upper portion of the display panel by a resin, the resin may be subject to curing under ultraviolet ("UV") light. During the process, resin may remain uncured in a portion of the resin that the UV light may not reach due to an apparatus causing interference. Monomers within the uncured resin may infiltrate into the print layer, thus causing discoloration of the print layer.

It is to be understood that this background of the technology section is intended to provide useful background for understanding the technology, and as such, the technology background section may include ideas, concepts, or recognitions that were not part of what was known or appreciated by those skilled in the pertinent art prior to a corresponding effective filing date of the subject matter disclosed herein.

SUMMARY

Embodiments of the present invention are directed to a display device including a print layer capable of efficiently reducing damage caused by ultraviolet ("UV") light and preventing or substantially preventing discoloration caused by uncured resins.

According to an exemplary embodiment, there is provided a display device including: a display panel configured to display an image; and a window panel located on the display panel, the window panel having a display area for transmitting an image displayed on the display panel, and a non-display area surrounding the display area, wherein the window panel includes: a window substrate; and a print layer on a lower surface of the window substrate in the non-display area, and including a silicon-based polymer or a fluorine-based polymer.

In an embodiment, the print layer includes: a silicon-based polymer or a fluorine-based polymer in an amount of about 30 percentage by weight (wt %) to about 90 wt %; a pigment in an amount of about 5 wt % to about 20 wt %; and an additive in an amount of about 0.1 wt % to about 5 wt %.

In an embodiment, the silicon-based polymer includes at least one of polymonomethylsiloxane, poiydimethylsiloxane, and polytrimethylsiloxane In an embodiment, the fluorine-based polymer includes at least one of polytetrafluoroethylene and polyperfluoroalkene.

In an embodiment, the print layer includes an additive, the additive includes an ultraviolet ("UV") absorber or an adhesion enhancer.

In an embodiment, the UV absorber includes at least one of benzotriazole, hydroxyphenyltriazine, cyanoacrylate, benzophenone, and hindered amine light stabilizer (HALS).

In an embodiment, the adhesion enhancer includes at least one of trialkoxy (alkyl) silane, trichloro (alkyl) silane, and perfluoro(alkyl) silane.

In an embodiment, the print layer includes a first print layer, a second print layer on a lower surface of the first print layer, and a third print layer on a lower surface of the second print layer.

In an embodiment, at least one of the first through third print layers includes a silicon-based polymer or a fluorine-based polymer.

In an embodiment, the first print layer includes a silicon-based polymer or a fluorine-based polymer.

In an embodiment, the first print layer has a horizontal width that is greater than a horizontal width of the second print layer, and wherein the second print layer has a horizontal width that is greater than a horizontal width of the third print layer.

In an embodiment, the first print layer is closer to the display area than the second print layer is, and wherein the second print layer is closer to the display area than the third print layer is.

In an embodiment, the second print layer includes a silicon-based polymer or a fluorine-based polymer.

In an embodiment, the second print layer covers an upper surface and a lateral surface of the first print layer, and a horizontal width of the third print layer is less than a horizontal width of the first print layer, and and is less than a horizontal width of the second print layer.

In an embodiment, the second print layer is closer to the display area than the first print layer is, and the first print layer is closer to the display area than the third print layer is.

In an embodiment, the third print layer includes a silicon-based polymer or a fluorine-based polymer.

In an embodiment, the third print layer covers a portion of an upper surface of the first print layer, an upper surface of the second print layer, and lateral surfaces of the first print layer and the second print layer, and a horizontal width of the second print layer is less than a horizontal width of the first print layer, and less than a horizontal width of the third print layer.

In an embodiment, the third print layer is closer to the display area than the first print layer is, and the first print layer is closer to the display area than the second print layer is.

According to an embodiment of the present invention, a display device is capable of representing color and texture, all at once, on a window panel; is capable of preventing or substantially preventing a print defect in which the color, absent the texture, is represented; and is capable of defining a distinct boundary between a display area and a non-display area.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
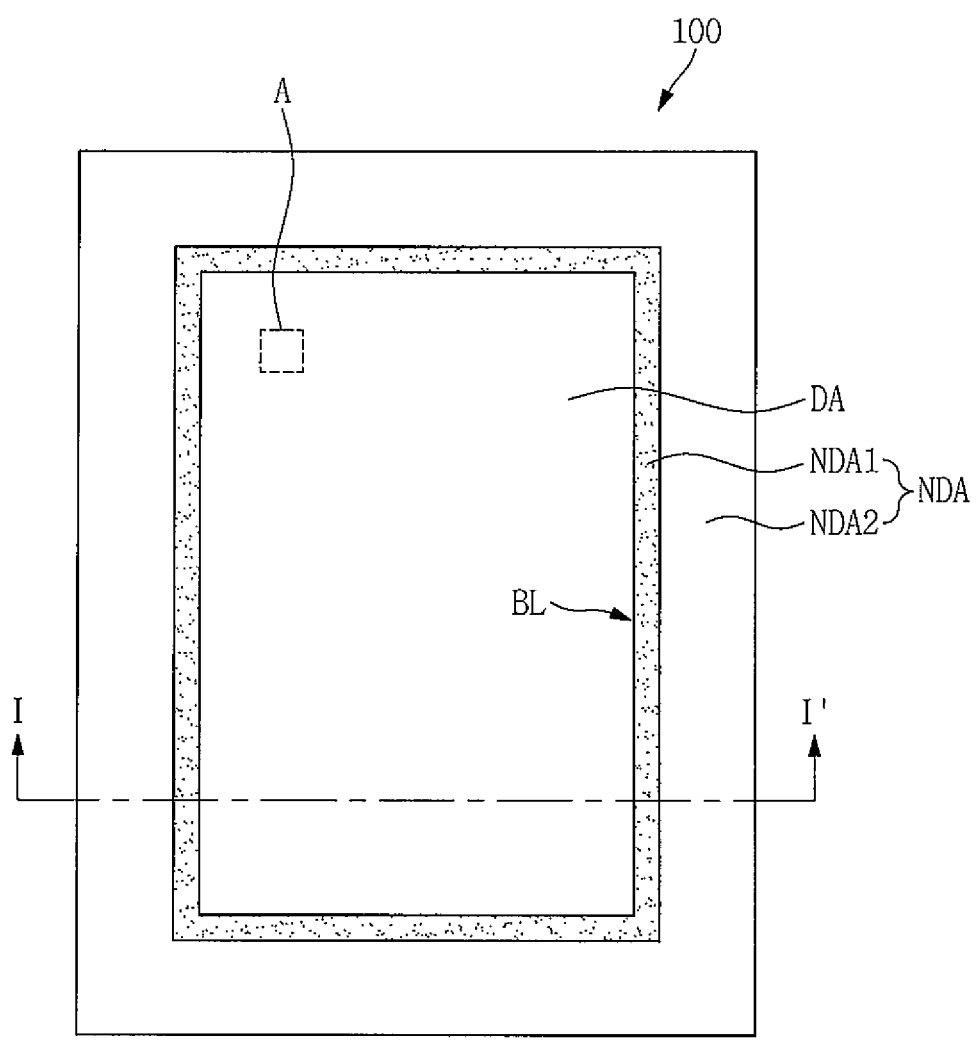
FIG. 1 is a schematic plan view illustrating a display device according to an exemplary embodiment of the present invention.

Features of embodiments of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is defined by the scope of the claims, and equivalents thereof. Therefore, well-known constituent elements, operations and techniques are not described in detail in the embodiments to prevent the present invention from being obscurely interpreted. Like reference numerals refer to like elements throughout the specification.

The terminology used herein is for the purpose of describing particular example embodiments and is not intended to be limiting. In the drawings, the thickness of layers and regions may be exaggerated for clarity.

Herein, an exemplary embodiment is described based on an organic light emitting diode ("OLED") display device including an organic light emitting layer. However, the present invention is not limited thereto, and a liquid crystal display ("LCD") device, a plasma display panel ("PDP") device, and/or a field emission display ("FED") device may also be applicable to a display device according to the present invention.

Further, in the accompanying drawings, an active-matrix-type organic light emitting diode ("AMOLED") display device having a 2Tr-1 Cap structure, which includes two thin film transistors ("TFT") and a capacitor in each pixel, is illustrated. However, the present invention is not limited thereto. In other words, the number of TFTs, capacitors, and wirings of the OLED display device may not be particularly limited. Herein, the term "pixel" refers to the smallest unit for displaying an image, and the OLED display device may display images using a plurality of pixels.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a display device according to an exemplary embodiment will be described further with reference to FIGS. 1 through 6.

FIG. 1 is a schematic plan view illustrating an OLED display device 100 according to an exemplary embodiment of the present invention.

Referring to FIG. 1, an upper plane surface of the OLED display device 100 may include a display area DA, and a non-display area NDA that is formed around the display area DA. The display area DA may be defined as an area for displaying an image to be displayed to an observer. The non-display area NDA may be defined as an area that may not display an image. The non-display area NDA may be printed in black. However, the present invention is not limited thereto, and the non-display area NDA may be printed in various colors other than black. For example, the non-display area NDA may be printed in white.

A portion of the upper plane surface of the OLED display device 100 illustrated in FIG. 1, in practice, may correspond to a portion of an upper plane surface of a window panel, the configuration of which will be described further below with reference to FIG. 2.

Referring back to FIG. 1, the non-display area NDA may include a first non-display area NDA1 formed around the display area DA, and a second non-display area. NDA2 formed around the first non-display area NDA1. The first non-display area NDA1 may be printed in black. The second non-display area NDA2 may be printed to have various suitable colors and textures, and may be a color other than black. For example, the second non-display area NDA2 may be printed in white and/or may be printed with a pearl pigment. However, the present invention is not limited thereto, and the second non-display area NDA2 may be printed to have another color and another texture.

A boundary, which may divide the display area DA from the non-display area NDA, may be defined as a boundary line BL. The boundary line BL may correspond to a contact surface between the display area DA and the non-display area NDA, and may be defined as an inner surface of the first non-display area NDA1.

Figure 2:
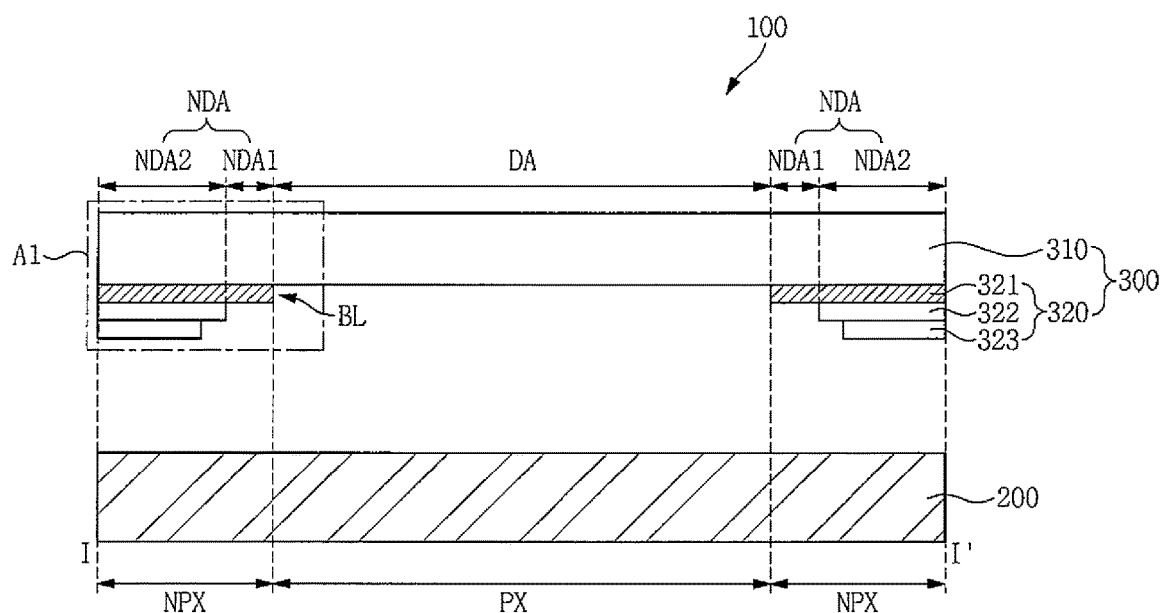
FIG. 2 is a cross-sectional view taken along the line I-I' of FIG. 1.

FIG. 2 is a cross-sectional view taken along the line I-I' of FIG. 1.

Referring to FIG. 2, the OLED display device 100 may include a display panel 200 having a pixel region PX and a non-pixel region NPX defined thereon, a window panel 300 having a display area DA and a non-display area NDA defined thereon, and an adhesive for adhering the display panel 200 and the window panel 300 to each other.

The display panel 200 may generate an image. The image generated in the display panel 200 may pass through the window panel 300 to be provided to a user. The window panel 300 may be located on an upper portion of the display panel 200 to protect the display panel 200 from formation of external scratches or damage.

An upper surface of the display panel 200 and a lower surface of the window panel 300 may be adhered to each other by the adhesive. The adhesive may be an ultraviolet ("UV")-curable resin. The adhesive may be an optically clear adhesive (OCA). In FIG. 2, for ease of description, the display panel 200 and the window panel 300 are depicted as being separated from each other.

The non-pixel region NPX may be formed around the pixel region PX, and the non-display area NDA may be formed around the display area DA. The pixel region PX of the display panel 200 may correspond to the display area DA of the window panel 300, and the non-pixel region NPX of the display panel 200 may correspond to the non-display area NDA of the window panel 300.

The pixel region PX of the display panel 200 may be defined as an area for generating and displaying an image. The non-pixel region NPX of the display panel 200 may be defined as an area that does not generate an image. The display panel 200 may include a plurality of pixels in the pixel region PX. Further, the display panel 200 may include, in the non-pixel region NPX, a driver for operating the pixels. The pixels may be operated by the driver and may generate an image (e.g., a preset or predetermined image).

The window panel 300 may include a window substrate 310 and a print layer 320.

A plane surface portion of the window substrate 310 may include a display area DA and a non-display area NDA formed around the display area DA, as in the plane surface portion of the window panel 300. The window substrate 310 may be located to face the display panel 200.

As described hereinabove, the non-display area NDA may include a first non-display area NDA1 formed around the display area DA, and a second non-display area NDA2 formed around the first non-display area NDA1.

The window substrate 310 may be a transparent film that may transmit light. Accordingly, an image generated in the pixel region PX of the display panel 200 may pass through the window substrate 310, in the display area DA, to be provided to a user.

The print layer 320 is located on a lower surface of the window substrate 310 facing the display panel 200, in the non-display area NDA. The print layer 320 may include an organic material having a color (e.g., a preset or predetermined color). Accordingly, in the non-display area NDA of the window substrate 310, the color of the print layer 320 may be perceived by a user.

The non-pixel region NPX of the display panel 200 may correspond to the non-display area NDA of the window panel 300. Accordingly, a portion of the driver located in the non-pixel region NPX of the display panel 200 may be visibly obstructed by the print layer 320 located in the non-display area NDA of the window panel 300, and thus may be invisible to a user.

The print layer 320 may have a black color. However, the present invention is not limited thereto, and the print layer 320 may have various suitable colors other than the black color. Accordingly, the print layer 320 may serve to shield light within the display panel 200, to prevent or substantially prevent the visibility of an inner structure thereof, and/or to determine the color of the window panel 300.

The print layer 320 may be formed by directly printing a printing composition on the window substrate 310. Alternatively, the print layer 320 may be formed by printing a printing composition on a transparent film, such as a polyethylene terephthalate (PET) film, and by then attaching, to the window substrate 310, the film including the print layer 320 formed thereon. However, the method of disposing the print layer 320 on the lower surface of the window substrate 310 is not limited thereto, and may be formed through various suitable methods known in the pertinent art.

The printing composition for forming the print layer 320 may include a silicon-based polymer or a fluorine-based polymer in an amount of about 30 percentage by weight (wt %) to about 90 wt %, a pigment in an amount of about 5 wt % to about 20 wt %, and other additives in an amount of about 0.1 wt % to about 5 wt %.

The print layer 320 may include a silicon-based polymer or a fluorine-based polymer as a main-chain polymer. In addition, the print layer 320 may further include polyethylene oxide and/or polypropylene oxide, so as to improve (e.g., increase) adhesion between print layers including other polymers additionally.

Examples of the silicon-based polymer may include polymonomethylsiloxane, polydimethylsiloxane, polytrimethylsiloxane, and/or the like.

Examples of the fluorine-based polymer may include polytetrafluoroethylene, polyperfluoroalkene, and/or the like.

As described hereinabove, the silicon-based polymer or the fluorine-based polymer, a main-chain polymer, may be present in an amount of about 30 wt % to about 90 wt %. When the amount of the silicon-based polymer or the fluorine-based polymer is less than about 30 wt %, the print layer 320 may not properly serve the function of the print layer. Because the print layer 320 is in need of other contents therewithin, it is desirable that the amount thereof is not more than about 90 wt %.

The kinds and the contents of the pigment may vary according to the color thereof. For example, in a case where the pigment is provided in black, a representative of which may be a carbon black, the pigment may be present in an amount of about 5 wt % to about 20 wt %. In a case where the pigment is present in an amount of less than about 5 wt %, the black color may appear lighter. On the other hand, in a case where the pigment is present in an amount of more than about 20 wt %, that may impart conductivity to the print layer 320 to allow electric current to flow, such that a touch issue may occur.

The silicon-based polymer, such as polymonomethylsiloxane, polydimethylsiloxane and polytrimethylsiloxane, may exhibit significant stability against UV light; however, a UV absorber (UV stabilizer) and an adhesion enhancer may further be included in the print layer 320.

The additive may generally be included in a small amount, and in a case where the amount of the additive is more than enough, performance of the print layer may rather deteriorate. In an example, the additive may be present in an amount of about 0.1 wt % to about 5 wt %.

Examples of the UV absorber may include benzotriazole, hydroxyphenyltriazine, cyanoacrylate, benzophenone, hindered amine light stabilizer (HALS), and/or the like. Examples of the hindered amine light stabilizer (HALS) may include Ciba™ Tinuvin®292, Ciba™ Tinuvin®328, Ciba™ Tinuvin®384 and Ciba™ Tinuvin® 1130, or the like, or a compound composed of several kinds thereof.

The adhesion enhancer, when including silane (R—SiX$_3$), may undergo chemical bonding with Si—OH, which is present on a surface of the window substrate 310, to thereby improve (e.g., increase) adhesion between the print layer 320 and the window substrate 310. The chemical bonding may not be easily broken by UV light. Herein, examples of the functional group R may include an alkyl group, a perfluoroalkyl group, an aromatic group, or the like. Further, X may be an alkoxy group, such as methoxy (—OCH$_3$), ethoxy (—OCH$_2$CH$_3$), and the like, or a halogen group, such as chlorine (Cl).

As illustrated in FIG. 2, the print layer 320 may include a plurality of print layers 321, 322, and 323. The print layers 321, 322, and 323 may include a first print layer 321 located on the lower surface of the window substrate 310 in the non-display area NDA, a second print layer 322 located on a lower surface of the first print layer 321, and a third print layer 323 located on a lower surface of the second print layer 322.

At least one of the first through third print layers 321, 322, and 323 may include a silicon-based polymer or a fluorine-based polymer, and in the present exemplary embodiment, the first print layer 321 may include the silicon-based polymer or the fluorine-based polymer.

The first print layer 321 may be located in the non-display area NDA. In an example, the first print layer 321 may be located on the lower surface of the window substrate 310 in the first non-display area NDA1 and in the second non-display area NDA2 of the non-display area NDA. A boundary between the display area DA and the non-display area NDA may be determined at the inner surface of the first print layer 321. That is, the boundary line BL, which is defined as the boundary between the display area DA and the non-display area NDA, may correspond to the inner surface of the first print layer 321.

The second print layer 322 and the third print layer 323 may be located in the second non-display area NDA2. For example, the second print layer 322 and the third print layer 323 may be spaced apart from the boundary line BL at an interval equal to a size of the first non-display area NDA1.

The color and the texture of the first print layer 321, the second print layer 322, and the third print layer 323 will be described further below.

The first, second, and third print layers 321, 322, and 323 may have a black color. A plurality of print layers, each having a black color, and which are located on the window substrate 310 in the non-display area NDA, may represent a black color more distinctively than a single print layer having a black color located thereon does. Due to the three of the first, second, and third print layers 321, 322, and 323, a black color may be represented in the non-display area NDA.

The first print layer 321 may be a light shielding layer. The first print layer 321 may have a black color in the first non-display area NDA1. The first print layer 321 having a black color may have a greater light shielding efficiency than those of the second print layer 322 and the third print layer 323. Due to such a structure, the inner surface of the first print layer 321 may be represented as the boundary line BL distinctively.

The second print layer 322 may be formed as a transparent print layer. In other words, the second print layer 322 may be formed to have a transparent color. The second print layer 322 may include a pearl pigment, which has a glittering property. In other words, the second print layer 322 may include the pearl pigment to provide, in the second non-display area NDA2, a visual effect of glittering to an observer. The second print layer 322 may include various suitable pigments representing various suitable textures other than those described hereinabove.

The third print layer 323 may have a color different from the color of the second print layer 322.

Hereinafter, a laminated structure of the print layer 320 according to an exemplary embodiment will be described further with reference to FIG. 3.

Figure 3:
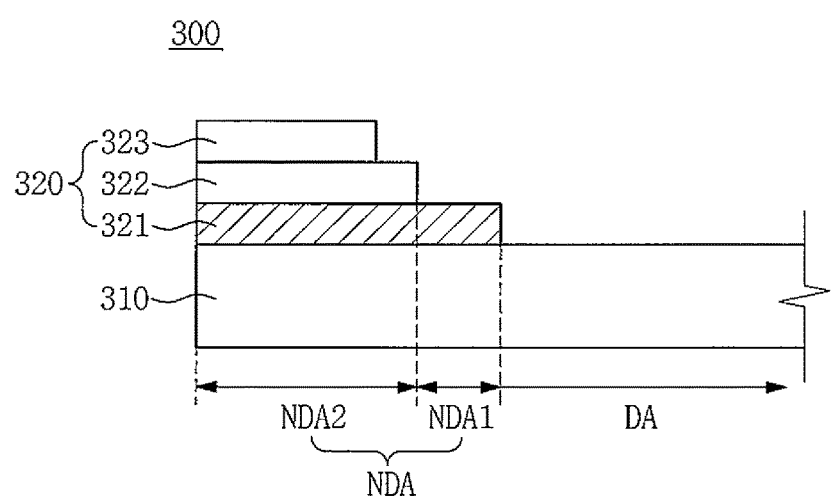
FIG. 3 is a schematic cross-sectional view illustrating a window panel according to an exemplary embodiment of the present invention.

FIG. 3 is an enlarged view illustrating the area A1 illustrated in FIG. 2. Although the window substrate 310 is depicted as being located below the print layer 320 for ease of description, it is to be understood that the print layer 320 is located on the lower surface of the window substrate 310.

In the window panel 300 of the display device according to an exemplary embodiment, the print layer 320 may include the first print layer 321, the second print layer 322 located on the lower surface of the first print layer 321, and the third print layer 323 located on the lower surface of the second print layer 322. The first print layer 321 may include a silicon-based polymer, a fluorine-based polymer, and/or the like.

A horizontal width of the first print layer 321 may be greater than a horizontal width of the second print layer 322, and the horizontal width of the second print layer 322 may be greater than a horizontal width of the third print layer 323. Hereinafter, the horizontal width may be measured along a direction substantially parallel to the extension direction of the substrate 310. The first print layer 321 may be located adjacent the display area DA, and may be closer to the display area DA than the second print layer 322 is; and the second print layer 322 may be located adjacent the display area DA, and may be closer to the display area DA than the third print layer 323 is.

Although the first through third print layers 321, 322, and 323 are illustrated in FIG. 2 by way of example, the present invention is not limited thereto, and more than three print layers may be located on the lower surface of the window substrate 310.

Hereinafter, a discoloration preventing effect of the present invention will be described further with reference to FIGS. 4A and 4B.

Figure 4A:
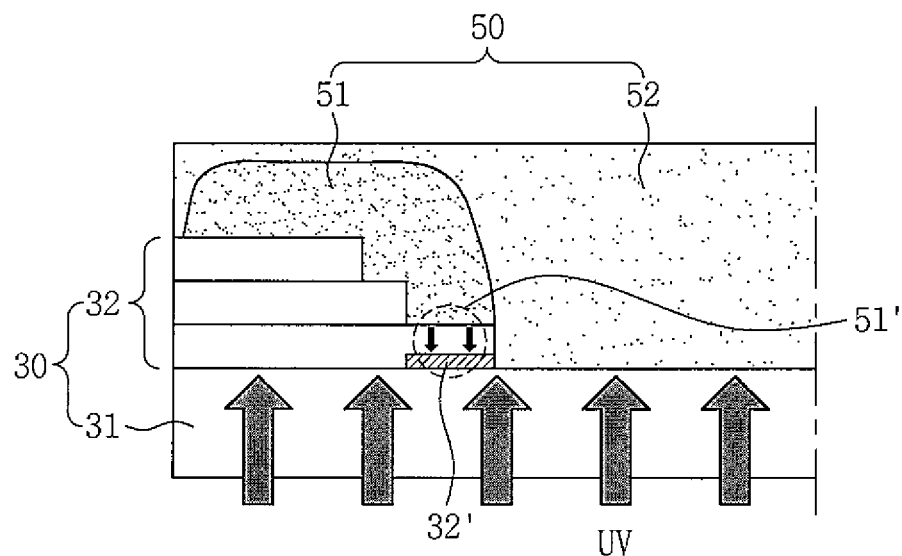
FIGS. 4A and 4B are cross-sectional views comparing a conventional window panel to the window panel of FIG. 1.
Figure 4B:
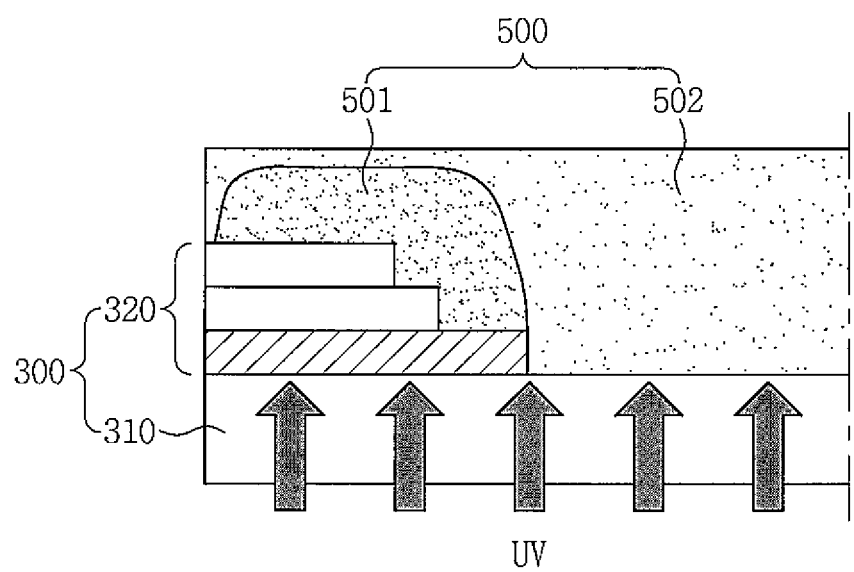

FIGS. 4A and 4B are cross-sectional views comparing a conventional window panel to the window panel of FIG. 1.

Referring to FIGS. 4A and 4B, FIG. 4A illustrates a conventional window panel 30, and FIG. 4B illustrates the window panel 300 according to an exemplary embodiment of the present invention.

The conventional window panel 30 may include a print layer 32 located in a non-display area of a window substrate 31. Examples of a printing composition forming a conventional print layer 32 may include epoxy, urethane, acrylate, or the like as a main-chain polymer. In the print layer 32 having such a conventional configuration, monomers 51' within a portion of a resin 51, which remain uncured beyond the reach of UV light, may infiltrate into the print layer 32 to cause discoloration 32' of the print layer 32, and thus an issue of the discoloration 32' being visible on the window substrate 31 may occur.

The window panel 300 according to an exemplary embodiment may include the print layer 320 located in the non-display area NDA of the window substrate 310. The printing composition forming the print layer 320 according to the present invention may include a silicon-based chemical compound or a fluorine-based chemical compound as a main-chain polymer. Because the silicon-based chemical compound or the fluorine-based chemical compound has excellent weather-resistant properties and chemical-resistant properties, monomers within a portion 501 of a resin, which remain uncured beyond the reach of UV light, might not infiltrate into the print layer 320 and therefore might not cause discoloration of the print layer 320. Accordingly, the print layer 320 according to the present invention may suitably serve as a print layer without causing a discoloration defect, and may prevent or reduce visible discoloration of the window substrate 310.

Hereinafter, a pixel of a display unit will be described with reference to FIGS. 5 and 6.

Figure 5:
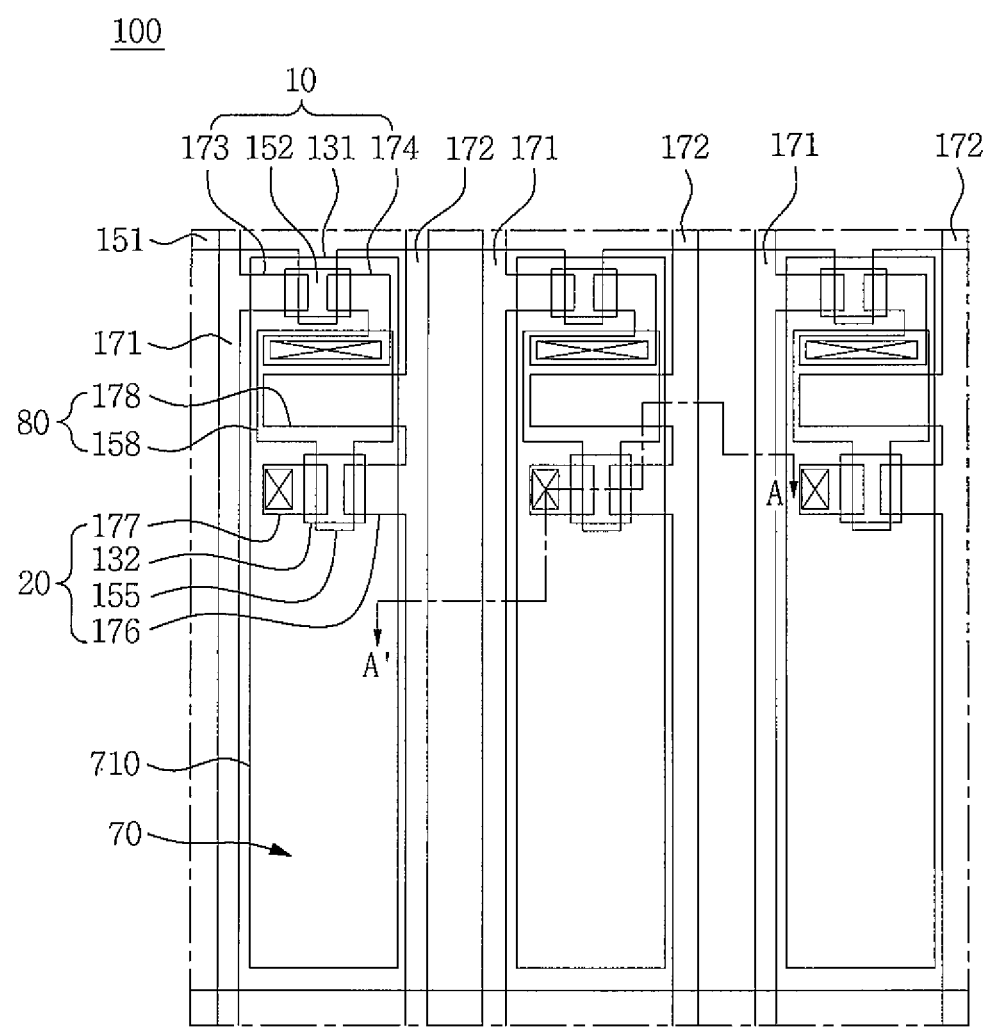
FIG. 5 is a schematic plan view illustrating a pixel of the area A of FIG. 1.

FIG. 5 is a schematic plan view illustrating a pixel of the area A of FIG. 1. FIG. 6 is a cross-sectional view taken along the line A-A' of FIG. 5.

Figure 6:
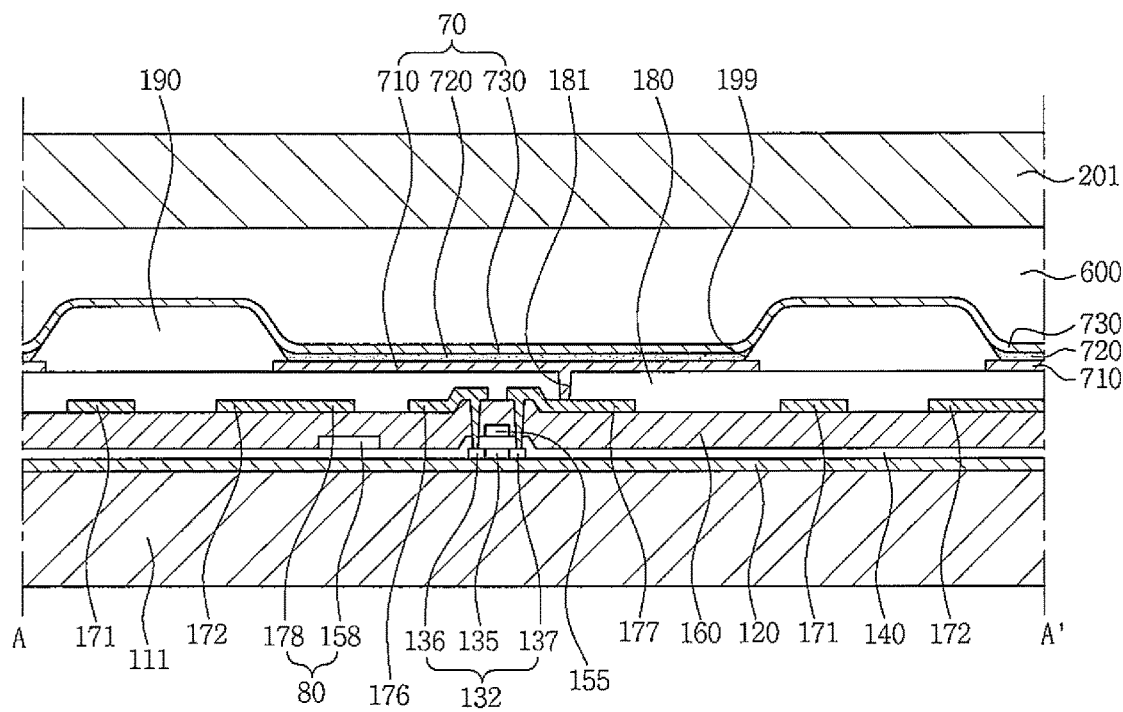
FIG. 6 is a cross-sectional view taken along the line A-A' of FIG. 5.

FIGS. 5 and 6 illustrate an active-matrix-type organic light emitting diode ("AMOLED") display having a 2Tr-1Cap structure, which includes two TFTs 10 and 20 and a capacitor 80 in each pixel, the pixel being provided in a display area DA (refer to FIG. 1, hereinafter "DA"). However, the present invention is not limited thereto.

For example, the OLED display device 100 may include three or more TFTs and two or more capacitors 80 in each pixel, and may further include additional wirings to have various suitable structures. Herein, the term "pixel" refers to the smallest unit for displaying an image, and the display area displays an image using a plurality of pixels.

The OLED display device 100 according to an exemplary embodiment includes a first substrate 111 and a plurality of pixels defined on the first substrate 111. Each pixel may include a switching TFT 10, the driving TFT 20, the capacitor 80, and the OLED 70. Further, the first substrate 111 may further include a gate line 151 located along one direction and a data line 171 and a common power line 172 insulated from and crossing (e.g., intersecting) the gate line 151.

Herein, each pixel may be defined by the gate line 151, the data line 171, and the common power line 172, but is not limited thereto.

The OLED 70 may include a first electrode 710, an organic light emitting layer 720 formed on the first electrode 710, and a second electrode 730 formed on the organic light emitting layer 720. Herein, at least one first electrode 710 may be formed on each pixel, and thus the first substrate 111 may include a plurality of first electrodes 710 spaced apart from each other.

Herein, the first electrode 710 is a positive end portion (anode) serving as a hole injection electrode, and the second electrode 730 is a negative end portion (cathode) serving as an electron injection electrode. However, the present invention is not limited thereto. For example, the first electrode 710 may be a negative end portion and the second electrode 730 may be a positive end portion, according to the driving method of the OLED display device 100. Further, the first electrode 710 may be a pixel electrode, and the second electrode 730 may be a common electrode.

A hole and an electron injected to the organic light emitting layer 720 may be combined with each other to form an exciton, and then light is emitted by energy generated when the exciton falls from an excited state to a ground state.

The capacitor 80 may include a pair of storage electrodes 158 and 178 with an insulating layer 160 interposed therebetween. Herein, the insulating layer 160 may include a dielectric material. Capacitance of the capacitor 80 is determined by electric charges accumulated in the capacitor 80, and by voltage across the pair of storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may function as a switching element that selects a pixel to perform light emission. The switching gate electrode 152 is connected to the gate line 151, and the switching source electrode 173 is connected to the data line 171. The switching drain electrode 174 is spaced apart from the switching source electrode 173 and is connected to the first storage electrode 158.

The driving TFT 20 may apply a driving power to the first electrode 710, which allows the organic light emitting layer 720 of the OLED 70 in a selected pixel to emit light. The driving gate electrode 155 is connected to the first storage electrode 158 that is connected to the switching drain electrode 174. The driving source electrode 176 and the second storage electrode 178 are respectively connected to the common power line 172.

The driving drain electrode 177 is connected to the first electrode 710 of the OLED 70 through a drain contact hole 181.

With the above-described structure, the switching TFT 10 may be operated by a gate voltage applied to the gate line 151, and may function to transmit, to the driving TFT 20, a data voltage applied to the data line 171.

A voltage equivalent to a difference between a common voltage applied from the common power line 172 to the driving TFT 20 and the data voltage transmitted from the switching TFT 10 may be stored in the capacitor 80, and current corresponding to the voltage stored in the capacitor 80 may flow to the OLED 70 through the driving TFT 20, so that the OLED 70 may emit light.

The OLED display device 100 according to an exemplary embodiment will be described in more detail with reference to FIGS. 5 and 6.

The OLED 70, the driving TFT 20, the capacitor 80, the data line 171, and the common power line 172 illustrated in FIG. 5 will be mainly described. Further, a switching semiconductor layer 131, a switching gate electrode 152, switching source and drain electrodes 173 and 174 of the switching TFT 10 may have the same laminated structure as the driving semiconductor layer 132, the driving gate electrode 155, and the driving source and driving drain electrodes 176 and 177 of the driving TFT 20, and thus the repeated description may not be provided.

According to an exemplary embodiment, the first substrate 111 may include an insulating substrate formed of glass, quartz, ceramic, plastic, or the like. However, the present invention is not limited thereto, and the first substrate 111 may include a metal substrate including stainless steel or the like.

A buffer layer 120 is formed on the first substrate 111. The buffer layer 120 may reduce or prevent infiltration of undesirable elements, may planarize a surface of the first substrate 111, and may include various suitable materials in accordance therewith. For instance, the buffer layer 120 may be formed of at least one of a silicon nitride ($SiN_x$), a silicon oxide ($SiO_2$), and a silicon oxynitride ($SiO_xN_y$). However, the buffer layer 120 might not be used, and may be omitted depending on the kinds of the first substrate 111 and process conditions thereof.

The driving semiconductor layer 132 is formed on the buffer layer 120. The driving semiconductor layer 132 may include semiconductor materials, such as polycrystalline silicon, amorphous silicon, oxide semiconductors, and/or the like. Further, the driving semiconductor layer 132 may include a channel region 135, which is not doped with impurities, and p+ doped source and drain regions 136 and 137, which are formed on both sides of the channel region 135. In this case, p-type impurities, such as boron B, may be doped using, for example, $B_2H_6$. Such impurities may vary depending on the kinds of the TFTs 10 and 20.

A gate insulating layer 140 formed of a silicon nitride ($SiN_x$) or a silicon oxide ($SiO_x$) is formed on the driving semiconductor layer 132. The gate insulating layer 140 may include tetra-ethoxysilane (TEOS), a silicon nitride ($SiN_x$), a silicon oxide ($SiO_2$), and/or the like. For example, the gate insulating layer 140 may have a double-layer structure in which, for example, a silicon nitride ($SiN_x$) layer having a thickness of about 40 nm, and a tetra-ethoxysilane layer (TEOS) having a thickness of 80 nm, are sequentially laminated. However, the gate insulating layer 140 according to an exemplary embodiment is not limited to the aforementioned configuration.

The driving gate electrode 155, the gate line 151 (refer to FIG. 5), and the first storage electrode 158 may be formed on the gate insulating layer 140. In this case, the driving gate electrode 155 may be formed to overlap at least a portion of the driving semiconductor layer 132. For example, the driving gate electrode 155 may overlap the channel region 135. The driving gate electrode 155 may prevent or substantially prevent the channel region 135 from being doped with impurities when the source and drain regions 136 and 137 of the driving semiconductor layer 132 are doped with the impurities during the forming of the driving semiconductor layer 132.

The driving gate electrode 155 and the first storage electrode 158 may be formed on the same layer, and may include substantially the same metal material. In this case, the metal material may include molybdenum (Mo), chromium (Cr), tungsten (W), and/or the like. For example, the driving gate electrode 155 and the first storage electrode 158 may include molybdenum (Mo), molybdenum (Mo) alloys, and/or the like.

The insulating layer 160 is formed on the gate insulating layer 140 to cover the driving gate electrode 155. The insulating layer 160 may be an interlayer insulating layer. The insulating layer 160 may be formed of a silicon nitride ($SiN_x$) or a silicon oxide ($SiO_x$), which is substantially similar to the gate insulating layer 140. The gate insulating layer 140 and the insulating layer 160 may have a contact hole to expose the source and drain regions 136 and 137 of the driving semiconductor layer 132.

The driving source and drain electrodes 176 and 177, the data line 171, the common power line 172, and the second storage electrode 178 are located on the insulating layer 160 in the display area DA. The driving source and drain electrodes 176 and 177 may be respectively connected to the source and drain regions 136 and 137 of the driving semiconductor layer 132 through the contact hole.

In an example, the driving source and drain electrodes 176 and 177, the data line 171, the common power line 172, and the second storage electrode 178 may be made of at least one of refractory metal, such as molybdenum, chromium, tantalum and titanium, or a metal alloy thereof, and may have a multi-layer structure including a refractory metal layer and a low-resistance conductive layer. Examples of the multi-layer structure may include: a double-layer structure including a chromium or molybdenum (alloy) lower film and an aluminum (alloy) upper film; and a triple-layer structure including a molybdenum (alloy) lower film, an aluminum (alloy) intermediate film, and a molybdenum (alloy) upper film.

The driving source and drain electrodes 176 and 177, the data line 171, the common power line 172, and the second storage electrode 178 may be formed of various suitable conductive materials other than the materials described hereinabove.

Accordingly, the driving TFT 20 may be formed including the driving semiconductor layer 132, the driving gate electrode 155, and the driving source and drain electrodes 176 and 177. However, the configuration of the driving TFT 20 is not limited thereto, and thus may be susceptible to various suitable modifications.

A protective layer 180 is formed on the insulating layer 160 to cover the driving source and drain electrodes 176 and 177, and the like. The protective layer 180 may be formed of organic materials, such as polyacrylate, polyimide, and/or the like. The protective layer 180 may be a planarization layer.

The protective layer 180 may be formed of at least one of polyacrylate resins, epoxy resins, phenolic resins, polyamide resins, polyimide reins, unsaturated polyester resins, polyphenylenether resins, poly-phenylenesulfide resins, and benzocyclobutene (BOB).

The protective layer 180 may have the drain contact hole 181 through which the driving drain electrode 177 is exposed.

The first electrode 710 is formed on the protective layer 180. The first electrode 710 may be connected to the driving drain electrode 177 through the drain contact hole 181 of the protective layer 180.

A pixel defining layer 190 is formed on the protective layer 180 to cover the first electrode 710. The pixel defining layer 190 may have an aperture 199 through which the first electrode 710 is exposed.

For example, the first electrode 710 may be located to correspond to the aperture 199 of the pixel defining layer 190. The pixel defining layer 190 may be formed of resins, such as polyacrylate resins, polyimide resins, and/or the like.

Further, the pixel defining layer 190 may be formed of a photosensitive organic material or a photosensitive polymer material. For example, the pixel defining layer 190 may be formed of polyacrylate, polyimide, photo sensitive polyimide (PSPI), photosensitive acryl (PA), photosensitive novolak resins, and/or the like.

The organic light emitting layer 720 is formed on the first electrode 710 within the aperture 199 of the pixel defining layer 190, and the second electrode 730 may be formed on the pixel defining layer 190 and the organic light emitting layer 720.

Accordingly, the OLED 70 may be formed including the first electrode 710, the organic light emitting layer 720, and the second electrode 730.

One of the first and second electrodes 710 and 730 may be formed of a transparent conductive material, and the other thereof may be formed of a transflective or reflective conductive material. Depending on the material forming the first and second electrodes 710 and 730, the OLED display device 100 may become a top-emission type, a bottom-emission type, or a dual-side-emission type.

For example, when the OLED display device 100 according to an exemplary embodiment is provided in the top-emission type, the first electrode 710 may be formed of the transflective or reflective conductive material, and the second electrode 730 may be formed of the transparent conductive material.

The transparent conductive material may include indium tin oxides (ITO), indium zinc oxides (IZO), zinc oxides (ZnO), indium oxides ($In_2O_3$), and/or the like. The reflective material may include of lithium (Li), calcium (Ca), lithium fluoride/calcium (LiF/Ca), lithium fluoride/aluminum (LiF/Al), aluminum (Al), silver (Ag), magnesium (Mg), gold (Au), and/or the like.

The organic light emitting layer 720 may be formed of low-molecular-weight organic materials or high-molecular-weight organic materials. The organic light emitting layer 720 may have a multi-layer structure including a light emitting layer, and at least one of a hole injection layer ("HIL"), a hole transporting layer ("HTL"), an electron transporting layer ("ETL"), and an electron injection layer ("EIL"). For example, the HIL may be located on the first electrode 710 that is a positive end portion, and the HTL, light emitting layer, ETL, and EIL may be sequentially laminated thereon.

According to the present exemplary embodiment, the organic light emitting layer 720 is only formed within the aperture 199 of the pixel defining layer 190, but the present invention is not limited thereto. For example, one or more layers of the organic light emitting layer 720 may be located not only on the first electrode 710, but also between the pixel defining layer 190 and the second electrode 730, within the aperture 199 of the pixel defining layer 190. For example, HIL, HTL, ETL, EIL, and the like of the organic light emitting layer 720 may be formed, using an open mask, on an area other than the aperture 199, and the light emitting layer of the organic light emitting layer 720 may be formed on each aperture 199 using a fine metal mask (FMM).

Further, when the exemplary embodiment is applied to an LCD device, the first electrode 710 may be physically and electrically connected to the driving drain electrode 177 through the drain contact hole 181, and may receive a data voltage from the driving drain electrode 177. The first electrode 710, which is configured to receive the data voltage, may generate an electric field along with a second electrode (e.g., a common electrode) 730 that receives a common voltage, thus determining a direction of liquid crystal molecules of a liquid crystal layer between the two electrodes. The first electrode 710 and the second electrode 730 may form a capacitor (hereinafter "a liquid crystal capacitor"), which may maintain an applied voltage although the TFT is turned off.

The second substrate 201 may be attached to the first substrate 111 to seal the first substrate 111, with the OLED 70 interposed therebetween. The second substrate 201 may cover and protect the TFTs 10 and 20 and the OLED 70 formed on the first substrate 111 to be externally sealed. An insulating substrate generally formed of glass or plastics may be used as the second substrate 201. When the OLED display device 100 is provided in the top-emission type in which an image is displayed through the second substrate 201, the second substrate 201 may be formed of a light-transmissive material.

A buffer member 600 is located between the first substrate 111 and the second substrate 201. The buffer member 600 may protect inner components, such as the OLED 70, from impacts externally imposed on the OLED display device 100. The buffer member 600 may increase device stability of the OLED display device 100. The buffer member 600 may include an organic sealant, such as urethane-based resins, epoxy-based resins, and/or acrylic resins, and an inorganic sealant, such as silicon. Examples of the urethane-based resin may include urethane acrylate. Examples of the acrylic resin may include butylacrylate and ethylhexylacrylate.

Hereinafter, window panels according to another exemplary embodiment and yet another exemplary embodiment will be described with reference to FIGS. 7 and 8.

Figure 7:
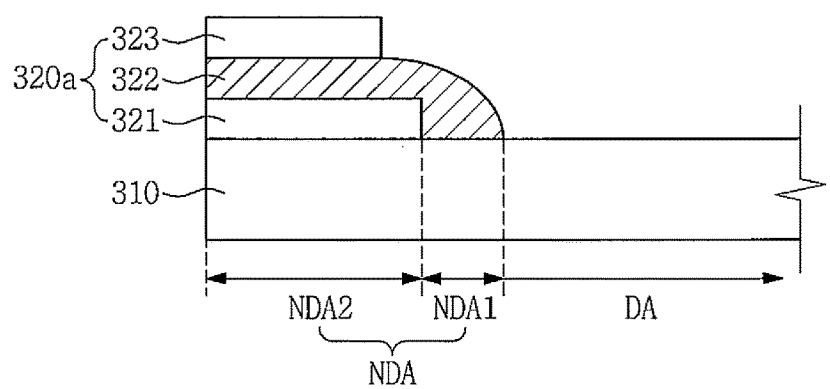
FIG. 7 is a schematic cross-sectional view illustrating a window panel according to another exemplary embodiment of the present invention.

FIG. 7 is a schematic cross-sectional view illustrating a window panel 300a according to another exemplary embodiment of the present invention.

The window panel 300a illustrated in FIG. 7 has a configuration that is substantially identical to that of the window panel 300 illustrated in FIGS. 1 through 3, with the exception of a configuration of a print layer 320a. Thus, configurations different from the configurations of the window panel 300 illustrated in FIGS. 1 through 3 will be described below. Further, like reference numerals refer to like elements throughout the specification.

In the window panel 300a of a display device according to another exemplary embodiment, the print layer 320a may include a first print layer 321, a second print layer 322 located on a lower surface of the first print layer 321, and a third print layer 323 located on a lower surface of the second print layer 322. The second print layer 322 may include a silicon-based polymer, a fluorine-based polymer, and/or the like.

Referring to FIG. 7, the second print layer 322 may cover an upper surface and a lateral surface of the first print layer 321, and a horizontal width of the third print layer 323 may be less than a horizontal width of the first print layer 321, and less than a horizontal width of the second print layer 322.

The second print layer 322 may be located closer to a display area DA than the first print layer 321 is, and the first print layer 321 may be located closer to the display area DA than the third print layer 323 is.

In more detail, the second print layer 322 may be located in a non-display area NDA. That is, the second print layer 322 may be located on a lower surface of a window substrate 310 in first and second non-display areas NDA1 and NDA2 of the non-display area NDA. A boundary between the display area DA and the non-display area NDA may be determined as an inner surface of the second print layer 322.

The first print layer 321 and the third print layer 323 may be located in the second non-display area NDA2. For example, the first print layer 321 and the third print layer 323 may be spaced apart from the boundary between the display area DA and the non-display area NDA at an interval equal to a size of the first non-display area NDA1.

Figure 8:
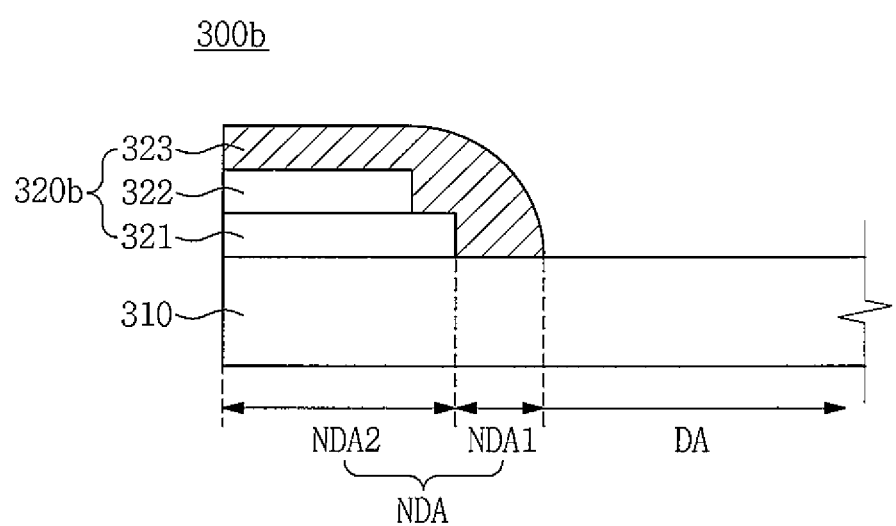
FIG. 8 is a schematic cross-sectional view illustrating a window panel according to yet another exemplary embodiment of the present invention.

FIG. 8 is a schematic cross-sectional view illustrating a window panel 300b according to yet another exemplary embodiment of the present invention.

The window panel 300b illustrated in FIG. 8 has a configuration that is substantially identical to that of the window panel 300 illustrated in FIGS. 1 through 3, with the exception of a configuration of a print layer 320b. Thus, configurations different from the configurations of the window panel 300 illustrated in FIGS. 1 through 3 will be described below. Further, like reference numerals refer to like elements throughout the specification.

In the window panel 300b of a display device according to yet another exemplary embodiment, the print layer 320b may include a first print layer 321, a second print layer 322 located on a lower surface of the first print layer 321, and a third print layer 323 located on a lower surface of the second print layer 322. The third print layer 323 may include a silicon-based polymer or a fluorine-based polymer.

Referring to FIG. 8, the third print layer 323 may cover a portion of an upper surface of the first print layer 321, an upper surface of the second print layer 322, and lateral surfaces of the first print layer 321 and the second print layer 322. Further, a horizontal width of the second print layer 322 may be less than a horizontal width of the first print layer 321, and less than a horizontal width of the third print layer 323.

The third print layer 323 may be located closer to a display area DA than the first print layer 321 is, and the first print layer 321 may be located closer to the display area DA than the second print layer 322 is.

For example, the third print layer 323 may be located in a non-display area NDA. That is, the third print layer 323 may be located on a lower surface of a window substrate 310 in first and second non-display areas NDA1 and NDA2 of the non-display area NDA. A boundary between the display area DA and the non-display area NDA may be determined as an inner surface of the third print layer 323.

The first print layer 321 and the second print layer 322 may be located in the second non-display area NDA2. For example, the first print layer 321 and the second print layer 322 may be spaced apart from the boundary between the display area DA and the non-display area NDA at an interval equal to a size of the first non-display area NDA1.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on," "connected to," "coupled to," or "adjacent" another element or layer, it can be directly on, connected to, coupled to, or adjacent the other element or layer, or one or more intervening elements or layers may be present. When an element or layer is referred to as being "directly on," "directly connected to," "directly coupled to," or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. §112, first paragraph, and 35 U.S.C. §132(a).

From the foregoing, it will be appreciated that various embodiments in accordance with the present disclosure have been described herein for purposes of illustration, and that various suitable modifications may be made without departing from the scope and spirit of the present teachings. Accordingly, the various embodiments disclosed herein are not intended to be limiting of the true scope and spirit of the present teachings, which is defined by the appended claims and equivalents thereof.

What is claimed is:
1. A display device comprising:
a display panel configured to display an image; and
a window panel located on the display panel, the window panel having a display area for transmitting an image displayed on the display panel, and a non-display area surrounding the display area, wherein the window panel comprises:
a window substrate; and
a print layer on a lower surface of the window substrate in the non-display area, and comprising a silicon-based polymer or a fluorine-based polymer,
wherein the print layer comprises a first print layer, a second print layer on the first print layer, and a third print layer on the second print layer, the second print layer covers an upper surface and a lateral surface of the first print layer, the third print layer having a horizontal width less than that of the first print layer and that of the second print layer.

2. The display device of claim 1, wherein the print layer comprises:
   a silicon-based polymer or a fluorine-based polymer in an amount of about 30 percentage by weight (wt %) to about 90 wt %;
   a pigment in an amount of about 5 wt % to about 20 wt %; and
   an additive in an amount of about 0.1 wt % to about 5 wt %.

3. The display device of claim 1, wherein the silicon-based polymer comprises at least one of polymonomethylsiloxane, polydimethylsiloxane, and polytrimethylsiloxane.

4. The display device of claim 1, wherein the fluorine-based polymer comprises at least one of polytetrafluoroethylene and polyperfluoroalkene.

5. The display device of claim 1, wherein the print layer comprises an additive, the additive comprises an ultraviolet ("UV") absorber or an adhesion enhancer.

6. The display device of claim 5, wherein the UV absorber comprises at least one of benzotriazole, hydroxyphenyltriazine, cyanoacrylate, benzophenone, and hindered amine light stabilizer (HALS).

7. The display device of claim 5, wherein the adhesion enhancer comprises at least one of trialkoxy (alkyl) silane, trichloro (alkyl) silane, and perfluoro(alkyl) silane.

8. The display device of claim 1, wherein the second print layer is on a lower surface of the first print layer, and the third print layer is on a lower surface of the second print layer.

9. The display device of claim 8, wherein at least one of the first through third print layers comprises a silicon-based polymer or a fluorine-based polymer.

10. The display device of claim 9, wherein the first print layer comprises a silicon-based polymer or a fluorine-based polymer.

11. The display device of claim 9, wherein the second print layer comprises a silicon-based polymer or a fluorine-based polymer.

12. The display device of claim 9, wherein the third print layer comprises a silicon-based polymer or a fluorine-based polymer.

13. The display device of claim 1,
   wherein the first print layer is closer to the display area than the third print layer is.

14. The display device of claim 1, wherein the second print layer is closer to the display area than the first print layer is, and
   the first print layer is closer to the display area than the third print layer is.

* * * * *